United States Patent
Guerrero Mercado

(10) Patent No.: US 7,560,958 B1
(45) Date of Patent: Jul. 14, 2009

(54) LOW POWER COMPARATOR WITH FAST PROPAGATION DELAY

(75) Inventor: Francisco Javier Guerrero Mercado, Landsberg am Lech (DE)

(73) Assignee: National Semiconductor Corporation, Santa Clara, CA (US)

(*) Notice: Subject to any disclaimer, the term of this patent is extended or adjusted under 35 U.S.C. 154(b) by 1066 days.

(21) Appl. No.: 10/619,169

(22) Filed: Jul. 14, 2003

(51) Int. Cl.
*H03K 5/22* (2006.01)

(52) U.S. Cl. .............. 327/58; 327/63; 327/65; 327/89

(58) Field of Classification Search .......... 327/52, 327/53, 54, 56, 58, 63, 65, 66, 67, 72, 77–79, 327/80, 81, 88, 89
See application file for complete search history.

(56) References Cited

U.S. PATENT DOCUMENTS

| | | | | |
|---|---|---|---|---|
| 5,563,533 | A | | 10/1996 | Cave et al. .................. 327/67 |
| 5,708,673 | A | * | 1/1998 | Ikeuchi .................. 372/29.01 |
| 5,841,306 | A | * | 11/1998 | Lim .......................... 327/228 |
| 6,051,999 | A | * | 4/2000 | To et al. ....................... 327/66 |
| 6,064,240 | A | * | 5/2000 | Wachter ................... 29/407.08 |
| 6,323,695 | B1 | * | 11/2001 | Heinrich ....................... 327/89 |
| 6,583,667 | B1 | * | 6/2003 | Dasgupta et al. ........... 330/254 |
| 6,617,926 | B2 | * | 9/2003 | Casper et al. ............... 330/258 |
| 6,617,938 | B1 | * | 9/2003 | Komiak ....................... 332/115 |
| 2001/0013851 | A1 | * | 8/2001 | Hashimoto et al. ........... 345/91 |
| 2002/0190885 | A1 | * | 12/2002 | Lin ............................. 341/144 |
| 2003/0034841 | A1 | * | 2/2003 | Fujimura et al. ............ 330/254 |
| 2003/0038677 | A1 | * | 2/2003 | Teramoto et al. ............ 330/254 |
| 2004/0164802 | A1 | * | 8/2004 | Hughes ...................... 330/261 |

OTHER PUBLICATIONS

Sedra et al. "Microelectronic Circuits", 1989, pp. 220-223, 337-347.*

* cited by examiner

*Primary Examiner*—Tuan Lam

(57) ABSTRACT

A direct relationship exists between an integrated comparator's propagation delay and the input differential pair's bias current and overdrive voltage. A new method using a pulsed bias scheme for the input differential pair improves propagation delay by more than one order of magnitude without increasing significantly the average quiescent current, as long as the pulse width of the bias current is small relative to the system clock. A voltage limiter optimizes the comparator's transition time and a built-in hysteresis circuit minimizes spurious output transitions whenever the pulsed bias current pulse changes state. The bias current pulse and sampling of the comparator occur in predefined relation to the system clock.

20 Claims, 4 Drawing Sheets

LOW POWER COMPARATOR WITH FAST PROPAGATION DELAY

TECHNICAL FIELD OF THE INVENTION

The present invention is directed, in general, to integrated circuit comparators and, more specifically, to reducing propagation delay in integrated circuit comparators.

BACKGROUND OF THE INVENTION

As illustrated in the equivalent circuit diagram depicted in FIG. 4, integrated circuit comparators typically include: a bias system generating a defined current bias to each transistor; an input differential pair—either complementary metal oxide semiconductor (CMOS) or bipolar junction transistors—that, for a given overdrive voltage $V(ov)=(V(inp)-V(inn))$ generate a differential current given by $I(ov)=gm*V(ov)$, where gm is the transconductance of the input differential pair at the steady-state operating point $V(ov)=0$ volts (V); a gain stage node ngain converting the current $I(ov)$ to (in the CMOS case) a voltage gain and having a transition speed depending on the overdrive current $I(ov)$ available, the voltage excursion required between the high and low levels at the ngain node, and the capacitive load at the ngain node, including any Miller capacitance from the comparator's output stage; and a gain stage assuring a given slew rate at the comparator output out.

Additional non-ideal effects for most comparators include random and systematic offset of the input differential pair, the common mode rejection ratio of the input differential pair, and power supply rejection and propagation delay dependence on the power supply voltage. For example, a comparator's propagation delay will typically be related to the applied overdrive voltage $V(ov)$, with a lower overdrive voltage resulting in a longer propagation delay.

Some techniques currently proposed or employed to reduce the comparator's propagation delay include reducing the capacitive loading of the comparator's ngain node, increasing the transconductance gm of the input differential pair by, for instance, increasing the bias current applied to that input differential pair, and reducing the voltage excursion of the ngain node to a minimum.

There is, therefore, a need in the art for alternatives for reducing an integrated circuit comparator's propagation delay while maintaining or reducing power consumption by the comparator.

SUMMARY OF THE INVENTION

To address the above-discussed deficiencies of the prior art, it is a primary object of the present invention to provide, for use in an integrated circuit comparator, a pulsed rather than continuous bias current applied, in at least a fast comparator configuration, to a current source within a comparator's input gain stage. The transconductance current will then be pulsed rather than continuous. The pulse width of the bias current is small relative to the system clock, but has a large current magnitude allowing the comparator to quickly respond to applied voltages. The end result is a fast comparator but without the large quiescent current associated with conventional fast comparators. A voltage limiter optimizes the ngain node voltage excursion. A built-in hysteresis circuit suppresses any spurious voltage spikes at the output node at every comparator's bias pulse. The bias current pulse and sampling of the comparator occur in predefined relation to the system clock.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4B, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
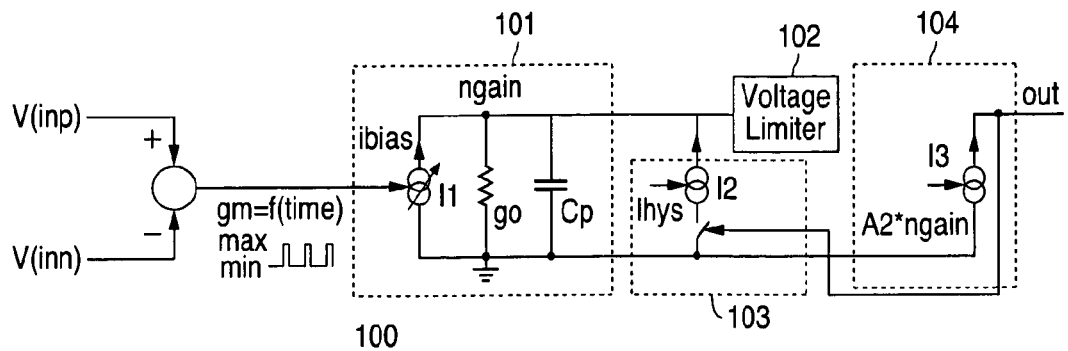
FIG. 1 depicts an equivalent circuit diagram for a low power integrated circuit comparator with fast propagation delay according to one embodiment of the present invention.

FIG. 1 depicts an equivalent circuit diagram for a low power integrated circuit comparator with fast propagation delay according to one embodiment of the present invention. Comparator circuit 100 is formed within an integrated circuit device and includes a differential input pair V(inp) and V(inn) producing a pulsed trans-conductance gm received as an input by a first gain stage 101. The pulse input changes the bias current Ibias from the current source I1, changing the bias current of the whole comparator 100.

The first gain stage 101 includes an output resistance go and output capacitance (including Miller capacitance) Cp in parallel with the current source I1. Connected to the output of the first gain stage 101 is a voltage limiter 102 and a built-in hysteresis circuit 103 including a current source I2 driven by a hysteresis current signal Ihys that is switched into and out of parallel connection with the first gain stage 101 at the output of the first gain stage 101 based on the comparator's output voltage out. Connected between the output of the first gain stage 101 (and to hysteresis circuit 103) is a second gain stage 104 including a current source I3 driven by a gain signal A2*ngain.

In the exemplary embodiment of the invention depicted in FIG. 1, the second gain stage 104 changes gain A2*ngain based on the pulsed input. However, in an optimized version of the circuit, the gain of the second gain stage 104 may remain constant (i.e., simply A2) since the transition delay for the second gain stage 104 is negligible with respect to the transition delay of the first gain stage 101.

The comparator 100 of the present invention employs the techniques described above for optimizing propagation delay within a given current budget defined by power consumption constraints, such as minimizing capacitive loading of the node ngain and keeping the voltage excursion of the ngain node to a minimum.

In addition, comparator 100 utilizes an input voltage that is steady at a defined time t1 relative to the system clock. An input signal pulse arrives at time t1 with a duration of pulse_w. While the input signal pulse is active, the internal bias current of the comparator increases by a factor n_speed=5*7=35 times; when the pulse signal becomes inactive, the internal bias current returns to the nominal level.

The output voltage out of the comparator is sampled at a time t2, where t2−t1>0 and t2−t1 is precisely defined, with the sampling period of duration t_sample commencing at t2. The small internal hysteresis circuit 103 reduces false triggering at the output out during the pulse_w period.

Comparator 100 is capable of operating within a large range of bias current values without inverting the output voltage out. That is, given a nominal bias current ibais, comparator 100 is able to operate with a bias current range between ibias/7 to 5*ibias.

In an i_power_low_speed mode (or "low power comparator" configuration), the quiescent current of the amplifier (first gain stage 101) is driven with a constant bias current of ibias/6, so that comparator 100 has low power consumption but a long propagation delay slow_prop. In an i_power_high_speed mode (or "fast comparator" configuration), the quiescent current of the amplifier is driven with a constant bias current of 5*ibias, such that comparator 100 has higher power consumption but a faster propagation delay fast_prop.

Figure 2A:
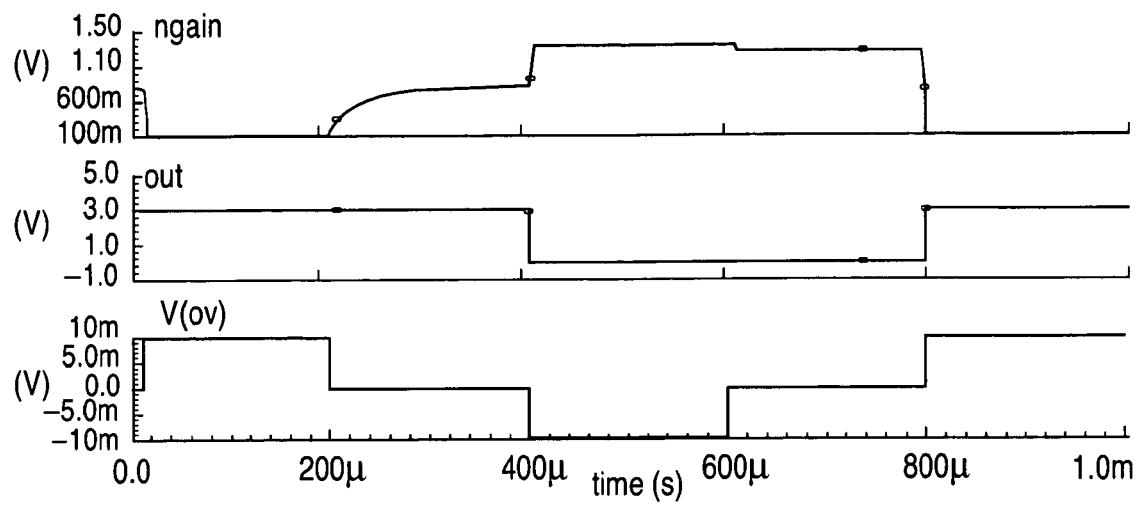
FIGS. 2A-2C are timing diagrams illustrating operation of a low power integrated circuit comparator with fast propagation delay according to one embodiment of the present invention.
Figure 2B:
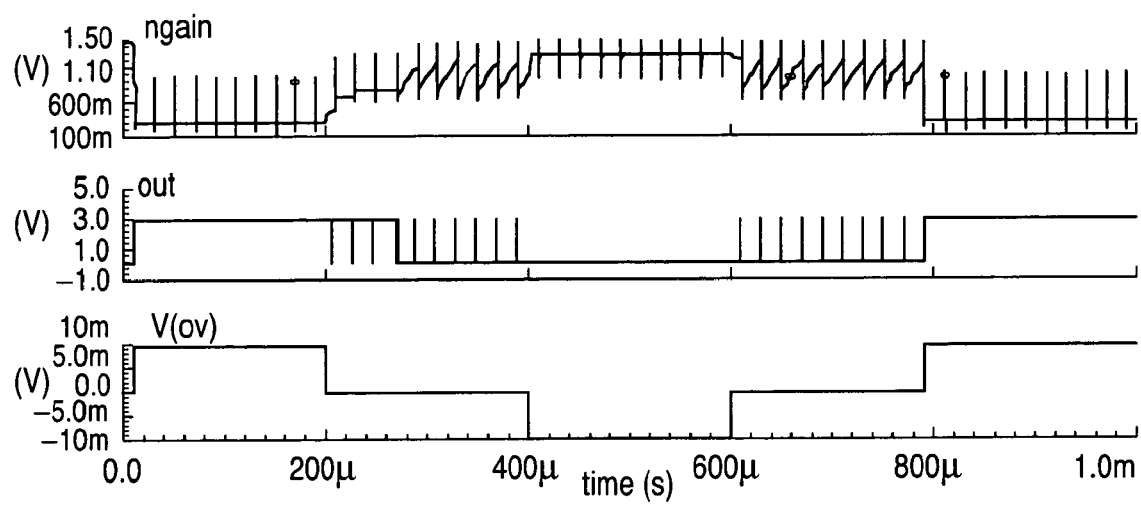
Figure 2C:
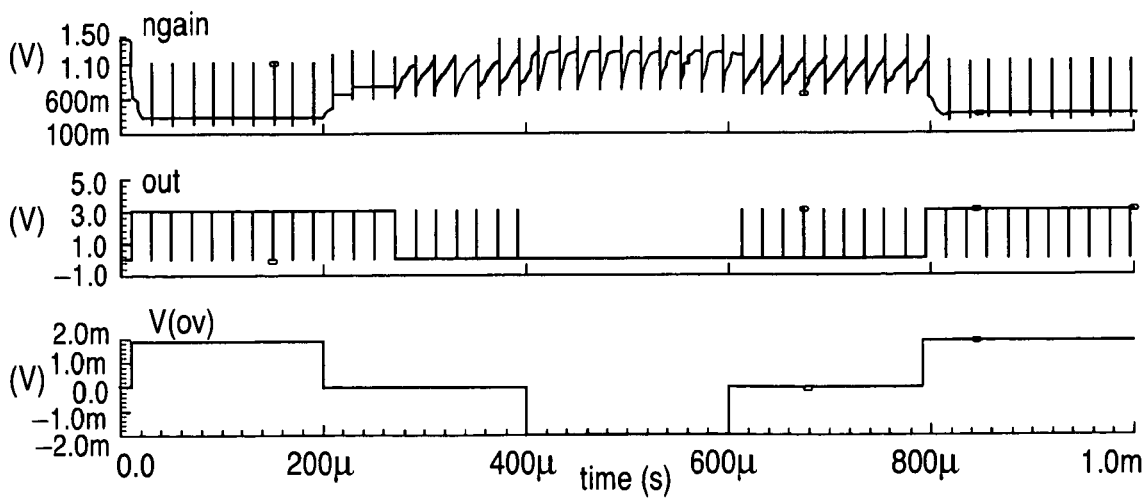

FIGS. 2A through 2C are timing diagrams illustrating operation of a low power integrated circuit comparator with fast propagation delay according to one embodiment of the present invention. FIG. 2A illustrates operation of comparator 100 in the low power comparator configuration. When the applied overdrive voltage V(ov) changes from +10 milli-Volts (mV) to 0, the voltage at node ngain changes slowly and the output voltage does not change (i.e., remains at 3 V or a logical "high"). Once the applied overdrive voltage V(ov) changes to −10 mV, the output voltage out toggles (i.e., changes to 0 V or a logical "low").

At room temperature with an integrated circuit comparator fabricated with typical processes and a V(inn) of 1.5 V, the worst case propagation delay for an overdrive voltage V(ov) varying between +10 mV, a worst case output propagation delay is approximately 5 microseconds (μs). Moreover, the propagation delay increases if the overdrive voltage V(ov) decreases. If V(ov)=±3 mV, the propagation delay increases to 30 μs. Comparator 100 will not toggle in the low power comparator configuration for (ov)<2.5 mV.

FIG. 2B illustrates operation of comparator 100 in the fast comparator configuration, but with a pulsed bias current. With the pulsed bias current at a pulse width of 390 nanoseconds (ns), the propagation delay shortens to 0.6 μs for an overdrive voltage V(ov)=±10 mV.

FIG. 2C illustrates operation of comparator 100 in the fast comparator configuration with pulsed bias current and an overdrive voltage V(ov)=±2 mV. The system clock employed has a period of 10 μs, giving a bias current pulse to clock period ratio of 390 ns/10 μs or 3.9%. The resulting output propagation delay is 0.8 μs. Aside from some narrow current spikes, the quiescent current ranges from 360 nano-Amps (nA) when the bias current pulse is active to 5 micro-Amps (μA) when the bias current pulse is inactive, with an average quiescent current for the fast comparator configuration of about 545 nA, or only approximately 50% more than the quiescent current of the slow comparator configuration despite an increase of the bias current magnitude from ibias/6 to 5*ibias.

With respect to the propagation delay performance of the slow comparator configuration, the fast comparator configuration with pulsed bias current takes 50% more quiescent current but improves propagation delay from 30 μs to 0.8 μs, more than 30 times faster.

A pulse generator (not shown in FIG. 1) coupled to the comparator 100 produces the 390 ns bias current pulse. Transistors within comparator 100 are sized for 600 nA of current, and the 2 mV built-in hysteresis and voltage limiting functions are added over existing comparator designs. The analog inputs are expected to reach their steady state before the falling edge of the system clock (clk) signal, where the system clock period is 20 μs and the clock duty cycle is 50%. The pulse generator produces a 390 ns wide pulse on every falling edge of the clk signal, and the comparator output out is sampled with the clk signers rising edge.

In the present invention, an overcurrent of nearly 5*7 times larger than the bias condition of the "low power" or slow comparator configuration drives the ngain node in the fast comparator bias condition, which helps the ngain node to reach steady state in a shorter time and reduce propagation delay. The comparator's average power consumption in pulsed bias current mode depends on the ration between pulse_w and t_sample. For a small pulse_w/t_sample ratio, the comparator's average power consumption will be similar to the value of the low power slow comparator configuration's i_power_low_speed.

In the exemplary embodiment, the comparator's propagation delay will range between values fast_prop/2 and fast_prop, with the resulting comparator having speed similar to the fast comparator configuration but with lower quiescent current. The pulsed bias current comparator with elevated bias current magnitude responds to smaller overdrive voltages V(ov) than the slow comparator configuration. Furthermore, the same principle employed in the present invention may be employed for an operational amplifier to reduce slewing and settling time while keeping a relatively small quiescent power consumption.

Figure 3:
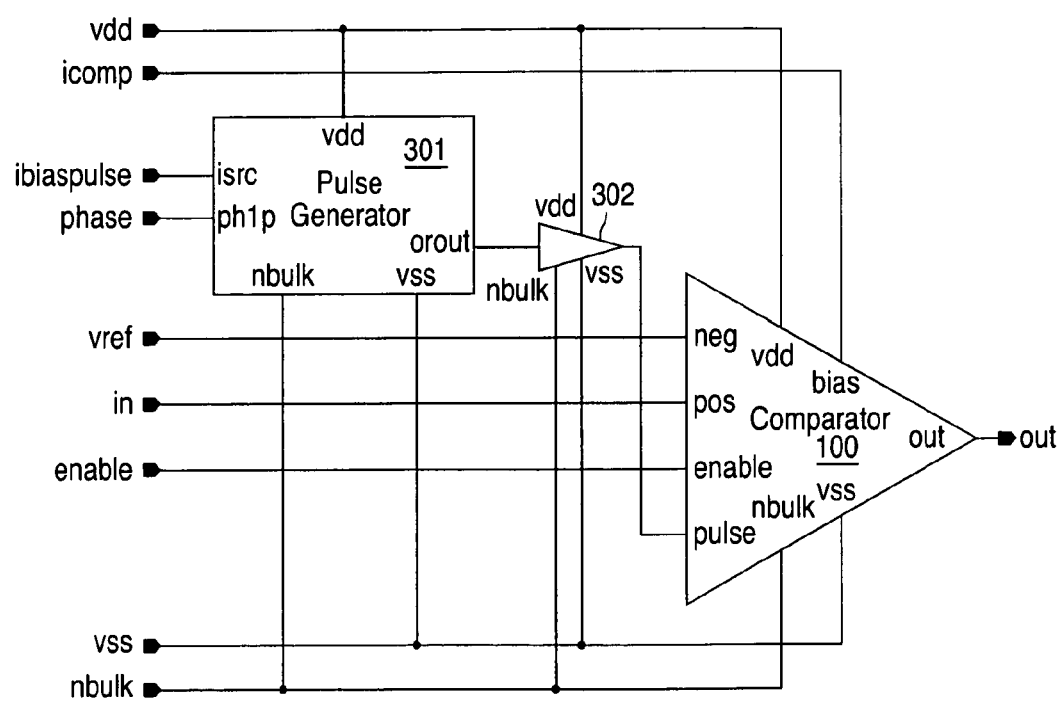
FIG. 3 is a block diagram of a low power integrated circuit pulse generator and comparator according to one embodiment of the present invention.
Figure 4:
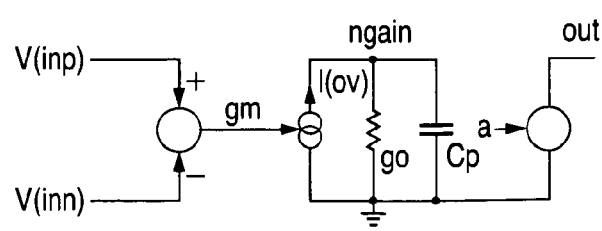
FIG. 4 is an equivalent circuit diagram of a typical integrated circuit comparator.

FIG. 3 is a block diagram of a low power integrated circuit pulse generator and comparator according to one embodiment of the present invention. System 300 includes pulse generator 301, a buffer or inverter 302, and comparator 100. The circuit 300 receives as inputs power supply voltages vss and vdd, a reference voltage vref and an input signal in to be compared to the reference voltage, an enable input enable, a phase triggered clock signal phase, a bulk bias voltage nbulk, comparator bias current icomp and a signal ibiaspulse biasing the pulse generator block and selecting pulsed biasing of the comparator 100.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

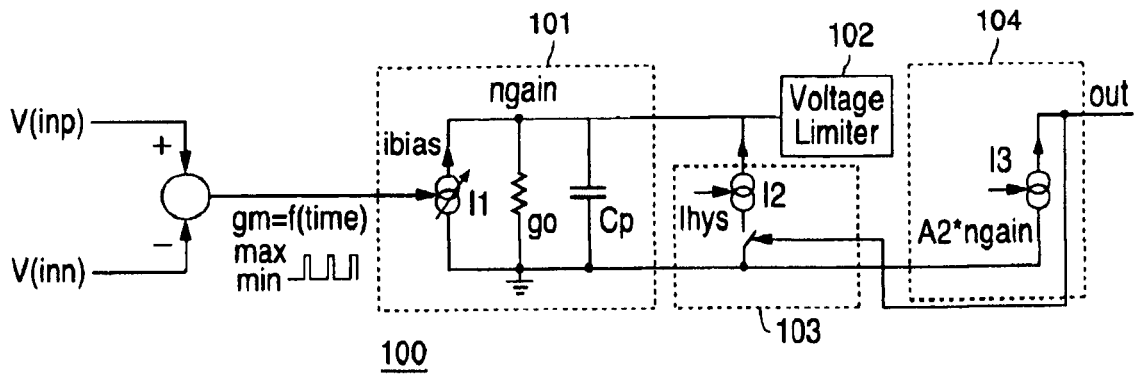

What is claimed is:

1. An integrated circuit comparator comprising:
   an input receiving an input signal representative of a difference between quantities to be compared; and
   an input gain stage receiving the input signal and biased with a pulsed bias current, the input gain stage producing a gain based upon the input signal.

2. The integrated circuit comparator according to claim 1, wherein the input signal is a current representative of transconductance of a differential pair of input transistors.

3. The integrated circuit comparator according to claim 1, wherein the input gain stage further comprises a current source biased by the pulsed bias current and controlled by the input signal.

4. The integrated circuit comparator according to claim 1, further comprising:
   a voltage limiter and a hysteresis circuit coupled to an output of the input gain stage to reduce spurious output transitions when the pulsed bias current changes state.

5. The integrated circuit comparator according to claim 4, further comprising:
   an output gain stage coupled to the hysteresis circuit and having a gain varying with the bias change of the input gain stage.

6. The integrated circuit comparator according to claim 4, further comprising:
   an output gain stage coupled to the hysteresis circuit and having a fixed gain and a propagation delay negligible with respect to a propagation delay of the input gain stage.

7. The integrated circuit comparator according to claim 1, wherein the pulsed bias current comprises a pulse at one edge of a system clock and an output of the comparator is sampled at another edge of the system clock.

8. The integrated circuit comparator according to claim 1, wherein the comparator selectively operates in a first mode in which the input gain stage is biased by a bias current with a defined first level value or in a second mode in which the input gain stage is biased by a bias current with a different second level value.

9. A method of operating an integrated circuit comparator comprising:
   receiving an input signal representative of a difference between quantities to be compared at an input for the comparator; and
   transmitting the input signal from the input to an input gain stage biased with a pulsed bias current, the input gain stage producing a gain based upon the input signal.

10. The method according to claim 9, wherein the input signal is a current representative of transconductance of a differential pair of input transistors.

11. The method according to claim 9, wherein the input gain stage further comprises a current source biased by the pulsed bias current and controlled by the input signal.

12. The method according to claim 9, further comprising:
    with an output signal from the input gain stage, driving a voltage limiter and a hysteresis circuit coupled to the output of the input gain stage to reduce spurious output transitions when the pulsed bias current changes state.

13. The method according to claim 12, further comprising:
    varying a gain of an output gain stage coupled to the hysteresis circuit with the bias change of the input gain stage.

14. The method according to claim 12, further comprising:
    fixing a gain of an output gain stage coupled to the hysteresis circuit and having a propagation delay negligible with respect to a propagation delay of the input gain stage.

15. The method according to claim 9, wherein the pulsed bias current comprises a pulse at one edge of a system clock and an output of the comparator is sampled at another edge of the system clock.

16. The method according to claim 9, wherein the comparator selectively operates in a first mode in which the input gain stage is biased by a continuous bias current or in a second mode in which the input gain stage is biased by the pulsed bias current.

17. An integrated circuit comprising:
    a comparator selectively operating in a first mode in which an input gain stage of the comparator is biased with a pulsed bias current and a second mode in which the input gain stage is biased with a continuous bias current.

18. The integrated circuit according to claim 17, wherein the input gain stage receives an input signal representative of a difference between quantities to be compared and produces a gain based upon a current for the input signal representative of transconductance of a differential pair of input transistors.

19. The integrated circuit according to claim 18, wherein the input gain stage further comprises a current source producing the pulsed or continuous bias current and controlled by the input signal.

20. The integrated circuit according to claim 19, further comprising:
    a voltage limiter and a hysteresis circuit coupled to an output of the input gain stage to reduce spurious output transitions when the pulsed bias current changes state.

* * * * *

UNITED STATES PATENT AND TRADEMARK OFFICE
CERTIFICATE OF CORRECTION

Figure 4A:
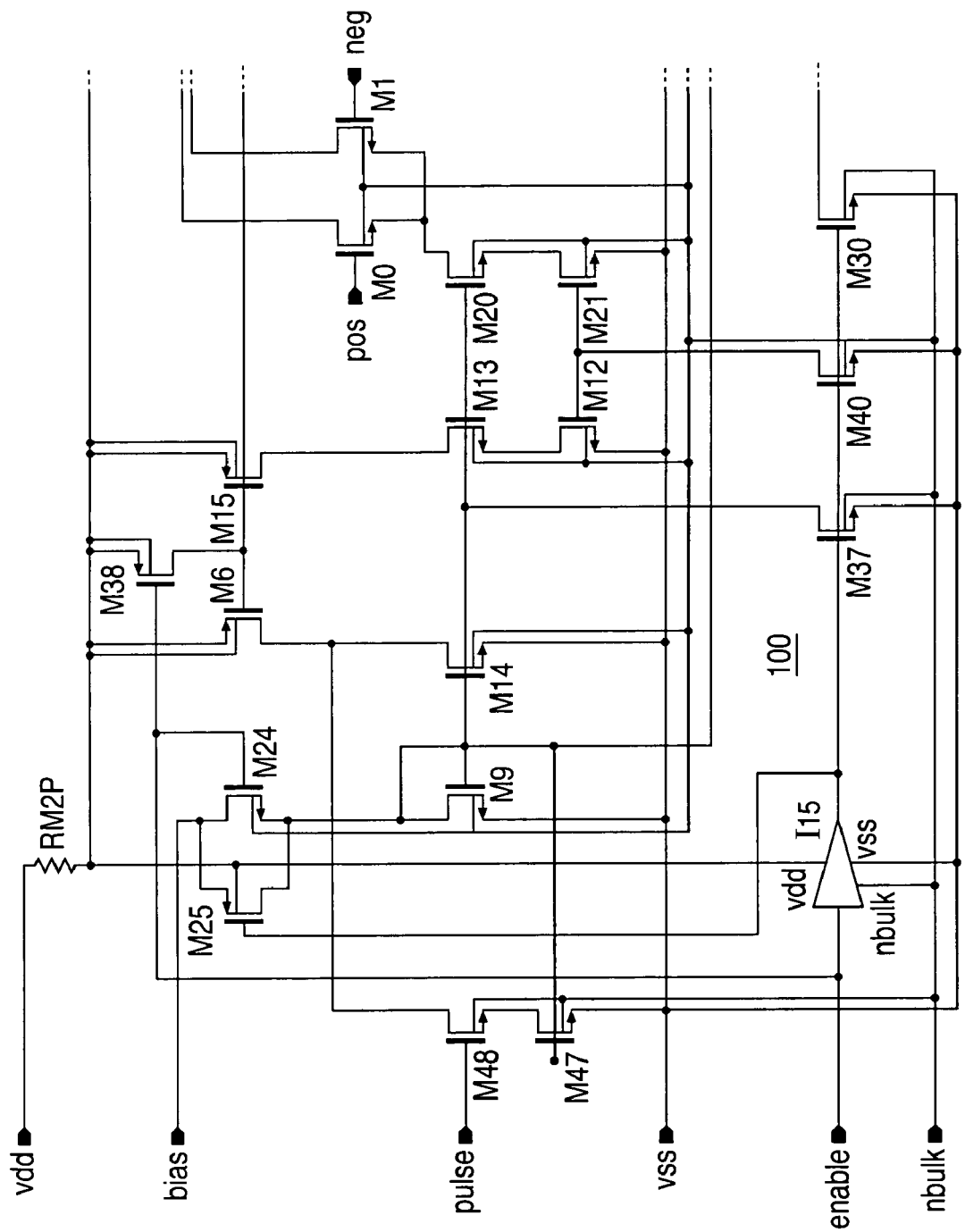
Figure 4B:
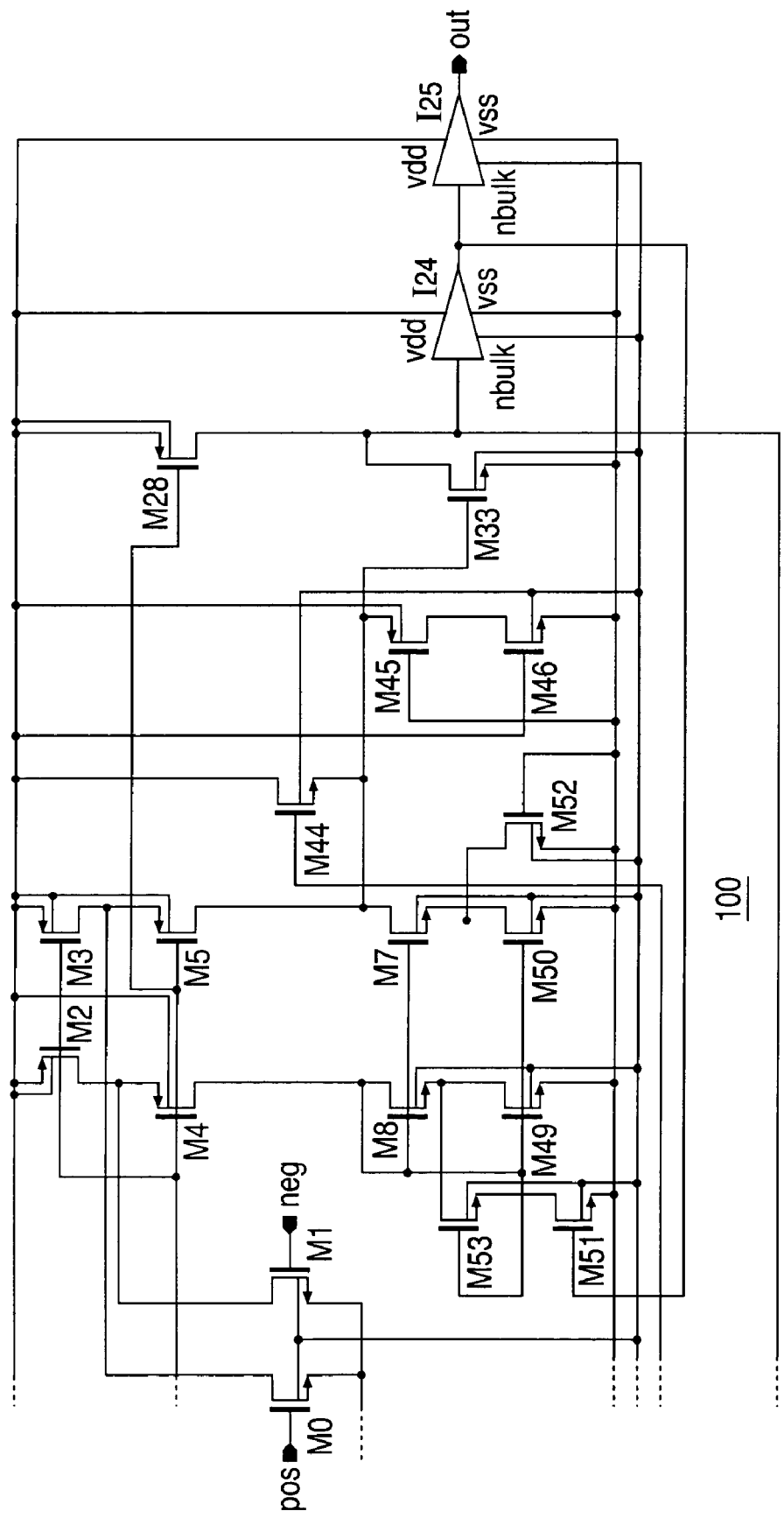
Figure 1:
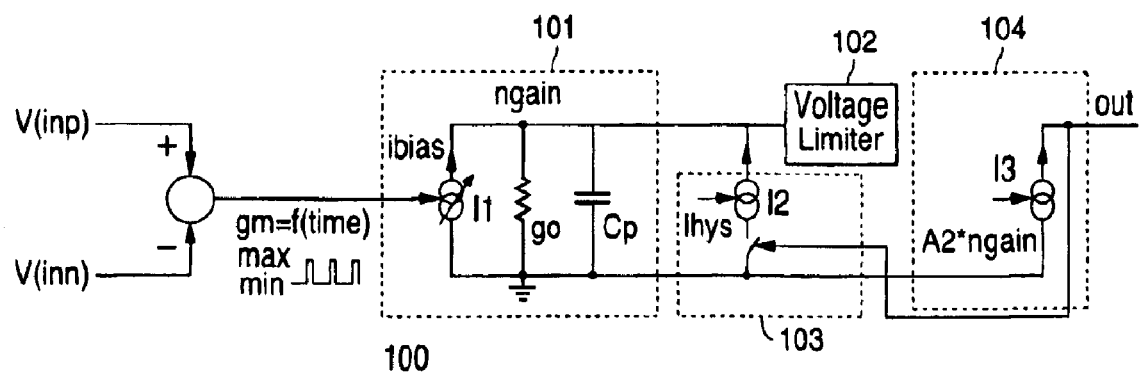
Figure 3:
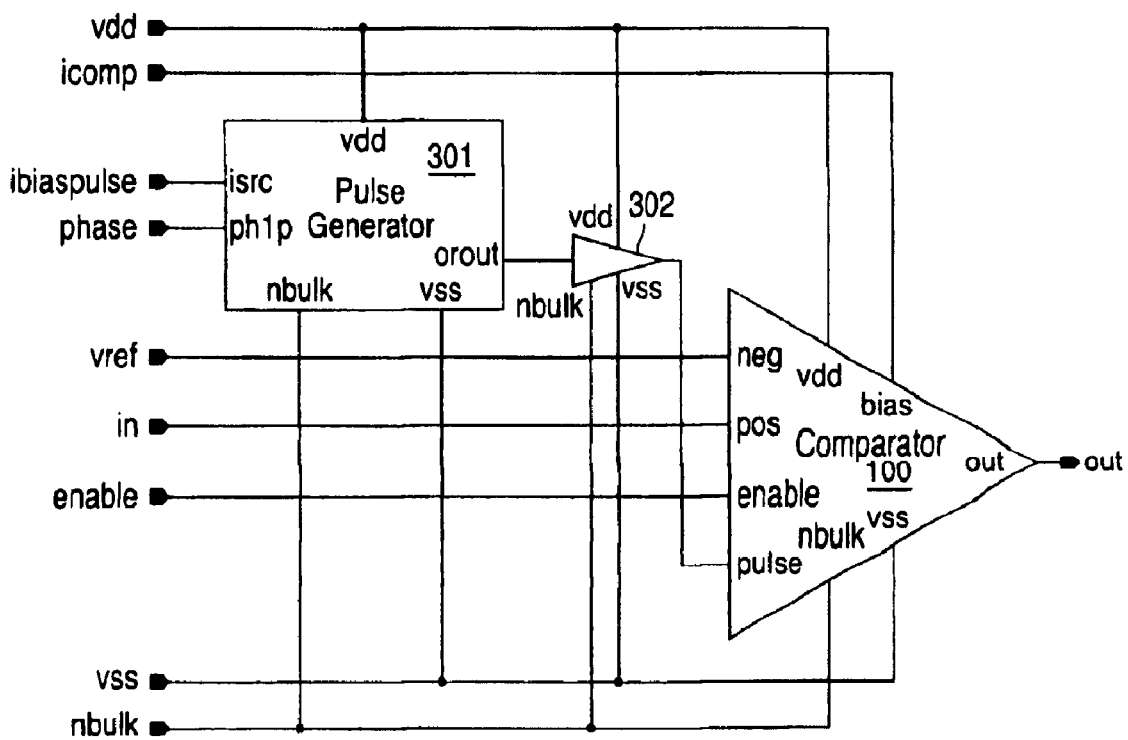
Figure 4:
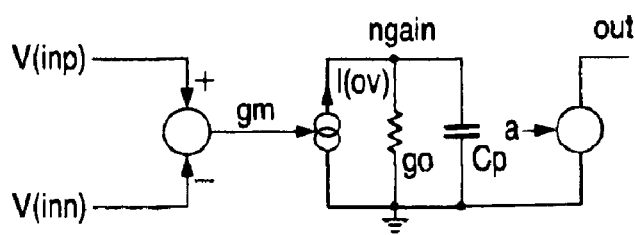
Figure 2A:
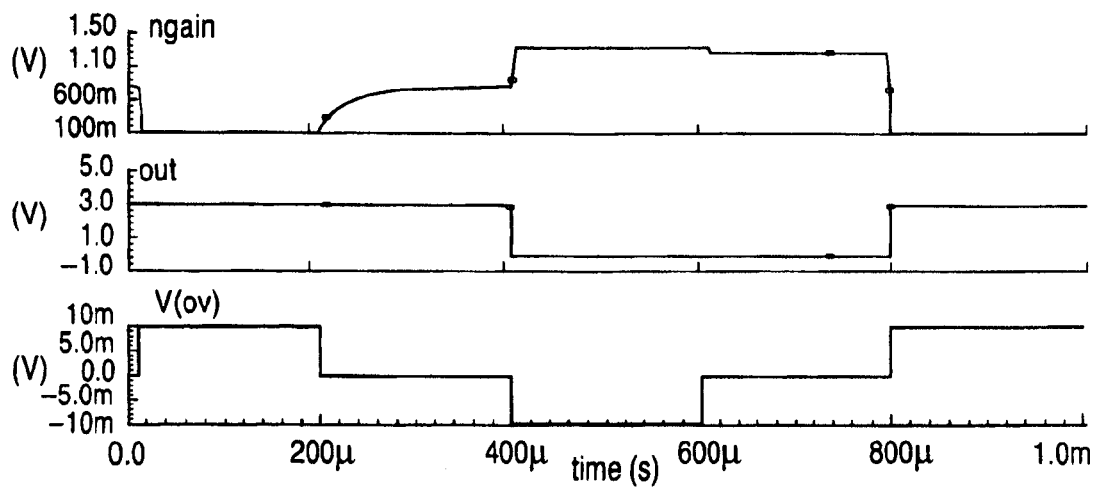
Figure 2B:
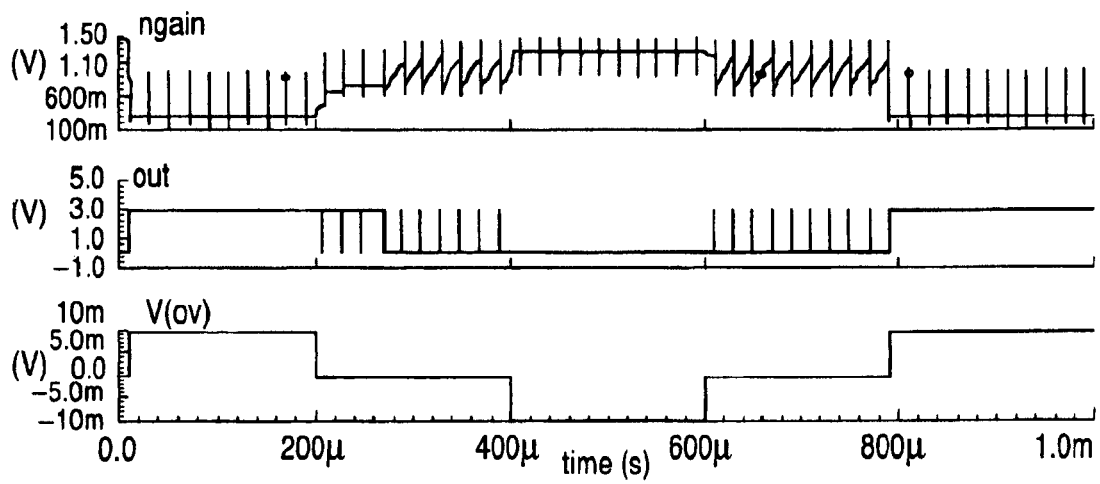
Figure 2C:
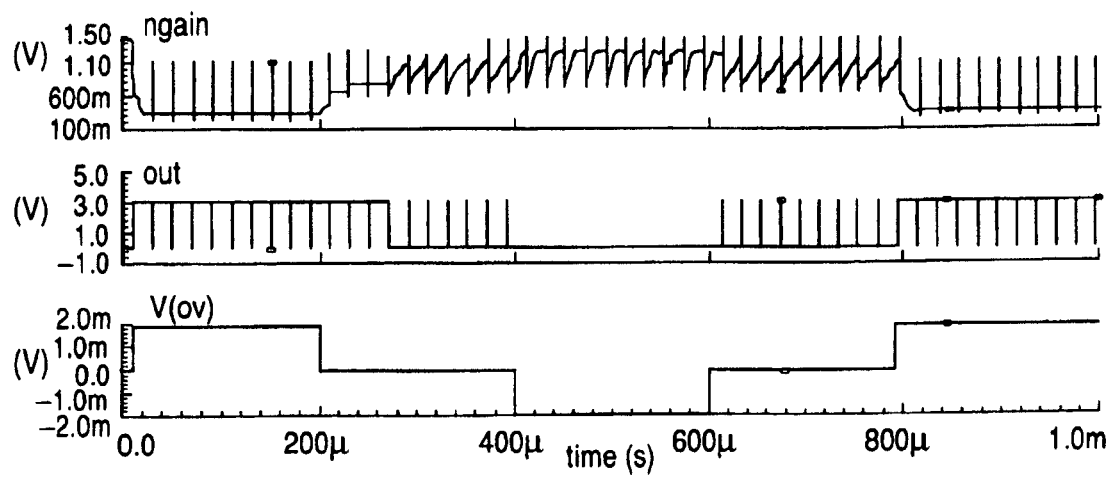

PATENT NO.         : 7,560,958 B1                                  Page 1 of 1
APPLICATION NO.    : 10/619169
DATED              : July 14, 2009
INVENTOR(S)        : Francisco Javier Guerrero Mercado It is certified that error appears in the above-identified patent and that said Letters Patent is hereby corrected as shown below:

In the Drawings, cancel Fig. 4A and Fig. 4B.

Signed and Sealed this

Eighteenth Day of May, 2010

David J. Kappos
*Director of the United States Patent and Trademark Office*

UNITED STATES PATENT AND TRADEMARK OFFICE
CERTIFICATE OF CORRECTION

PATENT NO.        : 7,560,958 B1                                                    Page 1 of 4
APPLICATION NO.   : 10/619169
DATED             : July 14, 2009
INVENTOR(S)       : Francisco Javier Guerrero Mercado It is certified that error appears in the above-identified patent and that said Letters Patent is hereby corrected as shown below:

Delete the title page and substitute therefore the attached title page showing the corrected number of Drawing Sheets in patent.

Delete Drawing Sheets 1-4 and substitute therefore the attached Drawing Sheets 1-2.

Signed and Sealed this

Twenty-second Day of June, 2010

David J. Kappos
*Director of the United States Patent and Trademark Office*

(12) United States Patent
Guerrero Mercado

(10) Patent No.: US 7,560,958 B1
(45) Date of Patent: Jul. 14, 2009

(54) LOW POWER COMPARATOR WITH FAST PROPAGATION DELAY

(75) Inventor: Francisco Javier Guerrero Mercado, Landsberg am Lech (DE)

(73) Assignee: National Semiconductor Corporation, Santa Clara, CA (US)

( * ) Notice: Subject to any disclaimer, the term of this patent is extended or adjusted under 35 U.S.C. 154(b) by 1066 days.

(21) Appl. No.: 10/619,169

(22) Filed: Jul. 14, 2003

(51) Int. Cl.
*H03K 5/22* (2006.01)
(52) U.S. Cl. .................. 327/58; 327/63; 327/65; 327/89
(58) Field of Classification Search .............. 327/52, 327/53, 54, 56, 58, 63, 65, 66, 67, 72, 77–79, 327/80, 81, 88, 89
See application file for complete search history.

(56) References Cited

U.S. PATENT DOCUMENTS

| 5,563,533 | A |   | 10/1996 | Cave et al. .................. 327/67 |
| 5,708,673 | A | * | 1/1998 | Ikeuchi ...................... 372/29.01 |
| 5,841,306 | A | * | 11/1998 | Lim ........................... 327/228 |
| 6,051,999 | A | * | 4/2000 | To et al. ..................... 327/66 |
| 6,064,240 | A | * | 5/2000 | Wachter ..................... 29/407.08 |
| 6,323,695 | B1 | * | 11/2001 | Heinrich ..................... 327/89 |
| 6,583,667 | B1 | * | 6/2003 | Dasgupta et al. .............. 330/254 |
| 6,617,926 | B2 | * | 9/2003 | Casper et al. ................ 330/258 |
| 6,617,938 | B1 | * | 9/2003 | Komiak ...................... 332/115 |
| 2001/0013851 | A1 | * | 8/2001 | Hashimoto et al. ............ 345/91 |
| 2002/0190885 | A1 | * | 12/2002 | Lin ........................... 341/144 |
| 2003/0034841 | A1 | * | 2/2003 | Fujimura et al. .............. 330/254 |
| 2003/0038677 | A1 | * | 2/2003 | Teramoto et al. ............. 330/254 |
| 2004/0164802 | A1 | * | 8/2004 | Hughes ....................... 330/261 |

OTHER PUBLICATIONS

Sedra et al. "Microelectronic Circuits", 1989, pp. 220-223, 337-347.*

* cited by examiner

*Primary Examiner*—Tuan Lam

(57) ABSTRACT

A direct relationship exists between an integrated comparator's propagation delay and the input differential pair's bias current and overdrive voltage. A new method using a pulsed bias scheme for the input differential pair improves propagation delay by more than one order of magnitude without increasing significantly the average quiescent current, as long as the pulse width of the bias current is small relative to the system clock. A voltage limiter optimizes the comparator's transition time and a built-in hysteresis circuit minimizes spurious output transitions whenever the pulsed bias current pulse changes state. The bias current pulse and sampling of the comparator occur in predefined relation to the system clock.

20 Claims, 2 Drawing Sheets